United States Patent
Woodall et al.

(10) Patent No.: US 8,823,316 B1
(45) Date of Patent: Sep. 2, 2014

(54) THERMAL EFFLUENT TO ELECTRIC ENERGY HARVESTING SYSTEM

(75) Inventors: Robert C. Woodall, Panama City, FL (US); Robert G. Adams, Panama City Beach, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 622 days.

(21) Appl. No.: 13/199,513

(22) Filed: Aug. 8, 2011

(51) Int. Cl.
*H02J 7/00* (2006.01)
*H02J 7/35* (2006.01)

(52) U.S. Cl.
CPC .................................. *H02J 7/35* (2013.01)
USPC ........................................ 320/101; 136/236.1

(58) Field of Classification Search
CPC ............ H02J 7/35; H02J 7/355; Y02E 60/12; H01M 10/465; H01M 16/006; H01L 35/22; H01L 35/20; H01L 35/16; H01L 35/32; H01L 35/34
USPC .......................................................... 320/101
See application file for complete search history.

(56) References Cited

U.S. PATENT DOCUMENTS

| | | | | |
|---|---|---|---|---|
| 3,779,814 A | * | 12/1973 | Miles et al. | 136/236.1 |
| 5,917,144 A | * | 6/1999 | Miyake et al. | 136/205 |
| 2003/0159922 A1 | * | 8/2003 | Miley | 204/290.03 |
| 2004/0079407 A1 | * | 4/2004 | Sharp | 136/236.1 |
| 2005/0271916 A1 | * | 12/2005 | Yang et al. | 429/20 |
| 2007/0034245 A1 | * | 2/2007 | Nakajima | 136/205 |
| 2008/0136364 A1 | * | 6/2008 | Calvarese | 320/101 |
| 2009/0085409 A1 | * | 4/2009 | Kearney-Fischer et al. | 307/115 |
| 2009/0315335 A1 | * | 12/2009 | Ujihara et al. | 290/1 R |
| 2010/0207573 A1 | * | 8/2010 | Mo et al. | 320/101 |

* cited by examiner

*Primary Examiner* — Arun Williams
(74) *Attorney, Agent, or Firm* — James T. Shepherd

(57) ABSTRACT

A system for harvesting electric energy from thermal energy includes energy conversion assemblies that can be distributed about a conduit through which a heated effluent flows. Each energy conversion assembly includes two heat sinks, a thermoelectric cell sandwiched between the two heat sinks, and a thermal insulating gasket surrounding the thermoelectric cell and separating the two heat sinks. Circuit wiring electrically connects to each thermoelectric cell where the energy conversion assemblies are electrically connected to one another in parallel. An electric power storage device is coupled to the circuit wiring.

21 Claims, 4 Drawing Sheets

THERMAL EFFLUENT TO ELECTRIC ENERGY HARVESTING SYSTEM

The invention described herein may be manufactured and used by or for the Government of the United States of America for Governmental purposes without payment of any royalties thereon or therefore.

ORIGIN OF THE INVENTION

1. Field of the Invention

The invention relates generally to energy conversion systems, and more particularly to an energy harvesting system that converts thermal energy present in a conduit-contained effluent to electric energy.

2. Background of the Invention

Reducing dependency on fossil fuels is an ongoing concern for the entire planet. One alternative form of energy under consideration is thermal energy. Currently, many sources of thermal energy are wasted. For example, it is estimated that approximately 80% of all energy generated in an internal combustion engine (powered with fossil fuel) is lost as heat leaving in the engine's exhaust. In terms of a ship underway or even at idle, a tremendous amount of thermal energy is lost as the ship's exhaust travels through and out its exhaust stacks. While some waste heat recovery systems do exist, they suffer from complexity that reduces system reliability and drives up maintenance costs thereby reducing the overall system effectiveness and efficiency. Further, some existing waste heat recovery systems use expensive and/or toxic refrigerants that are only effective in complex thermodynamic cycles.

SUMMARY OF THE INVENTION

Accordingly, it is an object of the present invention to provide a system that can harvest electrical energy from the thermal energy present in a heated effluent.

Another object of the present invention is to provide a simple system that can harvest electric energy from the thermal energy of an effluent flowing in a conduit.

Other objects and advantages of the present invention will become more obvious hereinafter in the specification and drawings.

In accordance with the present invention, a system for harvesting electric energy from thermal energy includes a plurality of energy conversion assemblies that can be distributed about a conduit through which a heated effluent flows. Each energy conversion assembly includes a first heat sink, a second heat sink, a thermoelectric cell with a first side thereof in contact with the first heat sink and a second side thereof in contact with the second heat sink, and a thermal insulating gasket surrounding the thermoelectric cell and separating the first and second heat sinks. Circuit wiring electrically connects to each thermoelectric cell where the energy conversion assemblies are electrically connected to one another. An electric power storage device is coupled to the circuit wiring.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
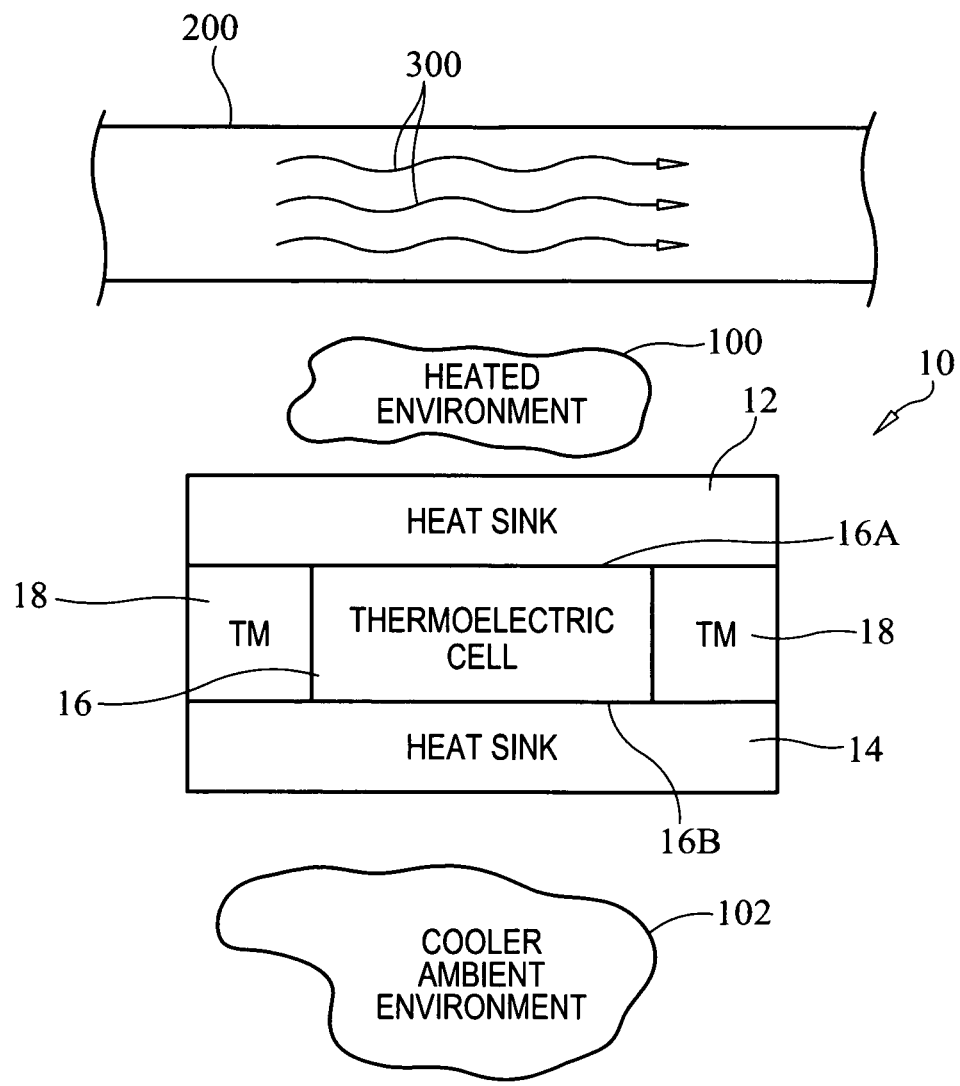
FIG. 1 is a schematic view of an energy conversion assembly used in an electric energy harvesting system of the present invention.
Figure 2:
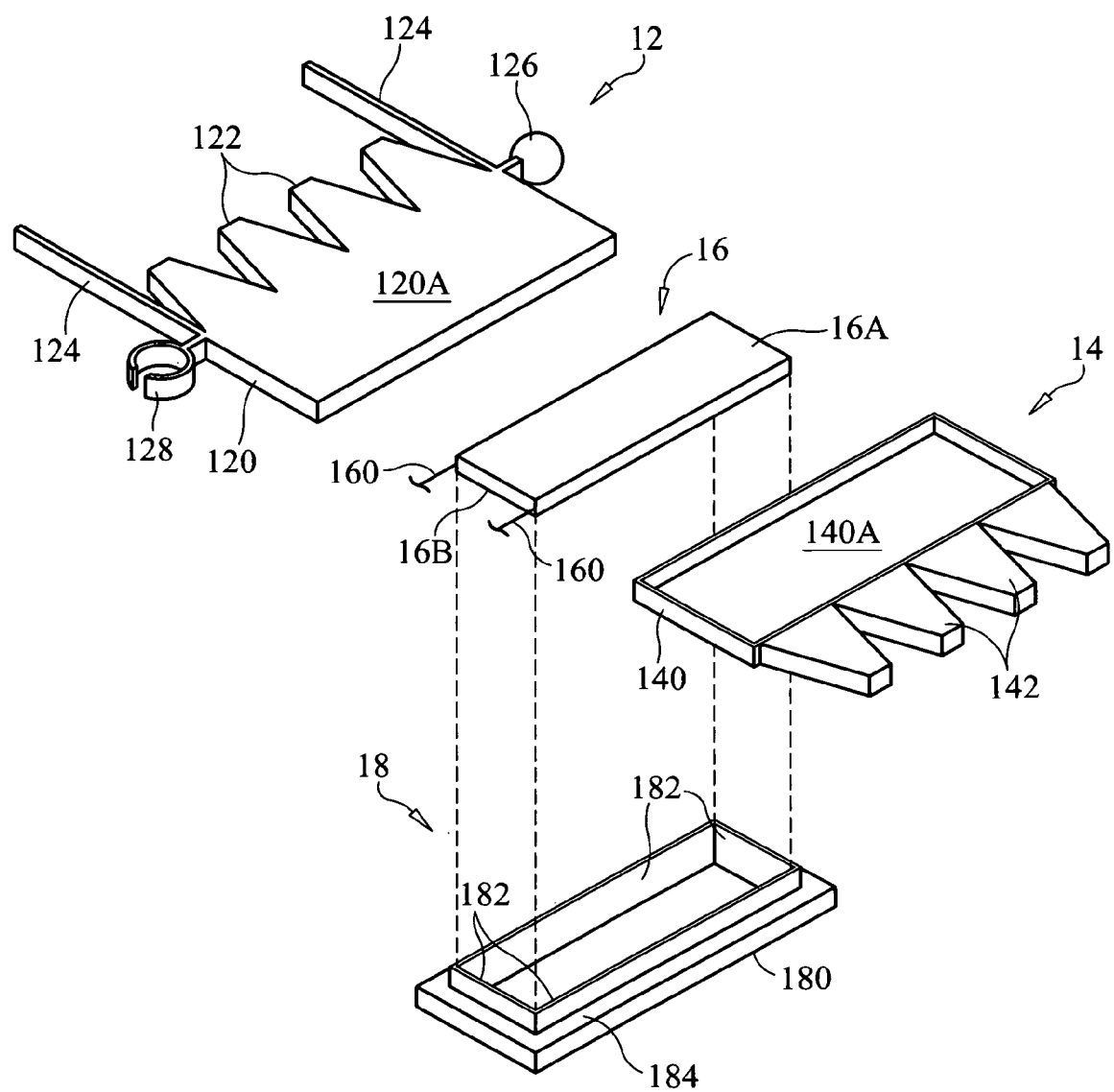
FIG. 2 is an exploded view of an energy conversion assembly in accordance with an embodiment of the present invention.
Figure 3:
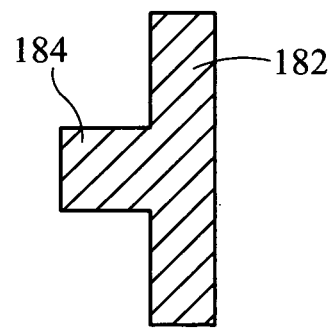
FIG. 3 is a cross-sectional view of the thermal insulating gasket in accordance with an embodiment of the present invention.
Figure 4:
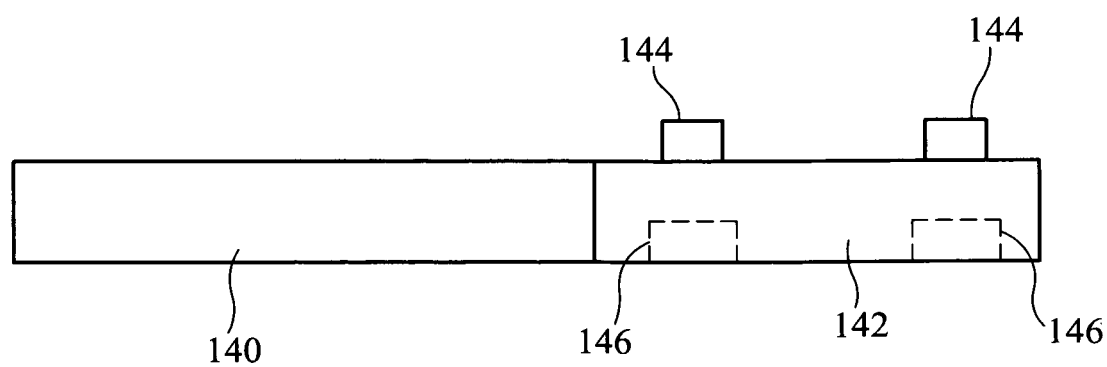
FIG. 4 is a side view of one heat sink frame and fins in accordance with an embodiment of the present invention.

Referring now to the drawings and more particularly to FIG. 1, an energy conversion assembly that will be used in an energy harvesting system of the present invention is shown and is referenced generally by numeral 10. As will be explained further below, a number of assemblies 10 will be used in an energy harvesting system. By way of example, such an energy harvesting system will be explained for its use with a ship's exhaust stack as a means to convert thermal energy just outside of the exhaust stack to electric energy for storage and use onboard the ship. In this way, embodiments of the present invention can be readily adapted for use with existing exhaust systems. However, it is to be understood that the present invention can be used to convert thermal energy to electric energy where the thermal energy is found within or at the outside of any conduit or tank containing a heated material or fluid.

Energy conversion assembly 10 includes two heat sinks 12 and 14 sandwiched about a thermoelectric cell 16 with a thermal insulating material ("TIM") 18 surrounding thermoelectric cell 16 and thermally separating/isolating heat sink 12 from heat sink 14. Heat sink 12 is facing/exposed to a heated environment 100 outside of a conduit 200 through which a heated effluent 300 is flowing. Heat sink 14 is facing/exposed to a cooler ambient environment 102 further from conduit 200 than heated environment 100. Thermoelectric cell 16 is a thermoelectric device that creates a voltage when there is a different temperature on its two sides 16A and 16B. This is known in the art as the Seebeck effect. For assembly 10, side 16A is in contact with heat sink 12 while side 16B is in contact with heat sink 14. Thermal insulating material 18 maintains a temperature gradient between sides 16A and 16B to maintain the Seebeck effect when assembly 10 is placed between environments 100 and 102.

By way of example, an embodiment of an energy conversion assembly and its inclusion in an energy harvesting system in accordance with the present invention will be explained with reference to FIGS. 2-5. Referring first to the exploded view of a single energy conversion assembly, heat sink 12 includes a thermally-conductive frame 120 having a planar region 120A and with heat exchanger fins 122 coupled to and extending away from one side of frame 120. Frame 120 can also serve as the support for a mounting bracket 124 which can be integrated with frame 120. Bracket 124 can be thermally conductive or non-conductive without departing from the scope of the present invention. As will be explained further below, mounting bracket 124 can be sized and configured to provide for the mounting of the energy conversion assembly to a conduit or tank (not shown in FIG. 2) carrying a heated material/effluent such that fins 122 are disposed a specified standoff distance away from the conduit. Bracket 124 can be configured such that this standoff distance can be adjusted to maintain the thermal gradient required for proper operation of thermoelectric cell 16.

Heat sink 14 also includes a thermally-conductive frame 140 having a planar region 140A. Heat exchanger fins 142 are coupled to and extend away from one side of frame 140. Planar regions 120A and 140A are sized and configured for full contact with sides 16A and 16B, respectively, of thermoelectric cell 16. Planar regions 120A and 140A could also be the base of a receptacle defined by frame 120 and 140, respectively, designed to securely hold thermoelectric cell 16 therein.

Thermal insulating material 18 is in the form of a gasket 180 sized to surround cell 16 and separate the peripheries of frames 120 and 140 when they are sandwiched about cell 16. In the illustrated embodiment and with additional reference to FIG. 3, gasket 180 includes an interior portion 182 and an external ledge 184 that extends radially away from interior portion 182. Interior portion 182 rests against the outer four sides of thermoelectric cell 16 when it is sandwiched between planar portions 120A and 140A. Ledge 184 is captured between the peripheries of frames 120 and 140 when the frames are sandwiched about thermoelectric cell 16. Electrical leads 160 are coupled to cell 16 so that electricity generated thereby can be transported therefrom. Although not shown, non-conducting fasteners (e.g., screws) will typically be used to couple frames 120 and 140 to one another when they are sandwiched about thermoelectric cell 16 with gasket 180 surrounding cell 16 and captured between frames 120 and 140.

Each energy conversion assembly of the present invention can also include one or more features that facilitate the joining of multiple ones of such assemblies. The features can be various types of mechanical couplings that define stacking links and/or pivoting links. For example, in terms of stacking links, some (or all) of heat exchanger fins 142 (and/or fins 122) can include pins 144 on one side thereof with a corresponding recess 146 on opposing side thereof as best seen in the side view of heat sink frame 140 and fins 142 shown in FIG. 4. In this way, energy conversion assemblies of the present invention can be vertically linked (via the pin-to-recess couplings) in a stack where pins 144 from one such assembly engage recesses 146 of another such assembly. To facilitate positioning of joined assemblies around the periphery of an installation, the mechanical coupling of adjacent assemblies can also define pivoting links or joints in order to wrap an energy harvesting system around a conduit or tank. For example, in terms of pivoting links, frame 120 (or frame 140) can have a, ball 126 mounted on one end thereof and a socket 128 mounted on an opposing end thereof. In this way, adjacent ones of such assemblies can be mechanically coupled by the mating of ball 126 on one assembly with socket 128 of an adjacent assembly. At the same time, the ball-and-socket coupling will allow adjacent assemblies to move relative to one another thereby facilitating wrapping of a "string" of such assemblies around a conduit's walls. The above-described coupling features can be used independently to create either a vertical stack of assemblies or a flexible string of assemblies, or can be used in combination to create a flexible "wall" of stacked assemblies.

Figure 5:
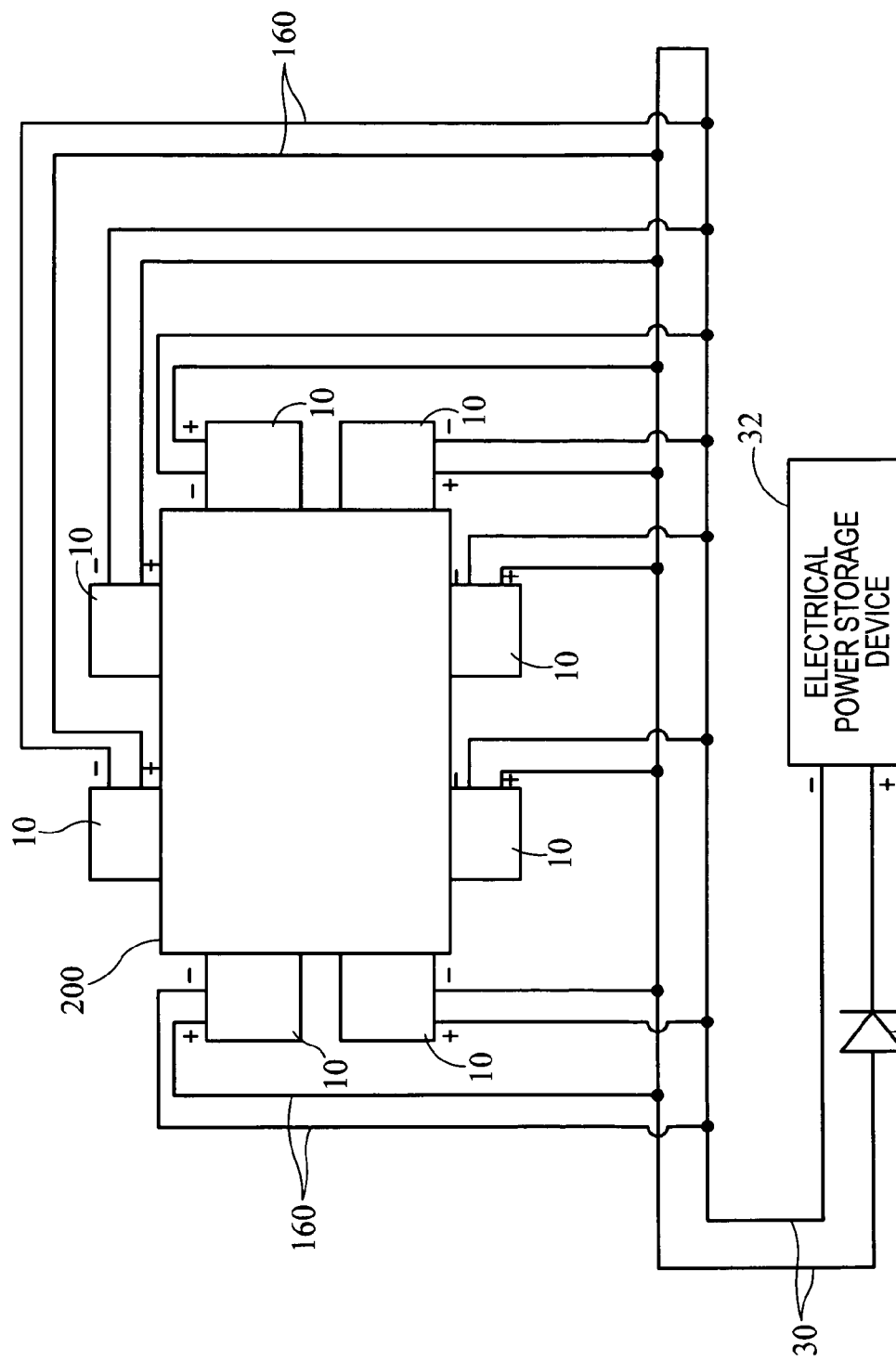
FIG. 5 is a schematic view of an electric energy harvesting system in accordance with an embodiment of the present invention where the system includes the circuit wiring and an energy storage device.

An exemplary use of the present invention's energy harvesting system is shown schematically in FIG. 5 where a number of energy conversion assemblies 10 are distributed about an exhaust stack 200 of, for example, a ship. The positive (+) and negative (−) leads 160 from each assembly's thermoelectric cell (not shown in FIG. 5 for clarity of illustration) are connected to corresponding positive and negative circuit leads 30. In the illustrated embodiment, assemblies 10 are electrically connected to one another in parallel. However, it is to be understood that assemblies 10 could also be electrically connected to one another in series, or assemblies 10 could be (electrically) arranged in multiple sets with each such set including two or more assemblies 10 electrically connected to one another in series and with the sets then being connected to one another in parallel. Regardless of the electrical connection configuration of assemblies 10, leads 30 are coupled to an electric power storage device 32 (e.g., a rechargeable battery) so that the voltage/current developed at assemblies 10 is made available to storage device 32. A diode 34 (or any other circuit element(s)) can be provided electrically between storage device 32 and assemblies 10 to prevent any unwanted current discharge from storage device 32.

Other arrangements of energy conversion assemblies could be used without departing from the scope of the present invention. For example, sets of energy conversion assemblies can be positioned at different standoff distances from a heated environment. In terms of an exhaust stack, concentric rings of energy conversion assemblies could be positioned about the exhaust stack where the expected thermal gradient at a particular ring of assemblies is used in the selection of the thermoelectric cells for that ring.

The advantages of the present invention are numerous. The energy harvesting system is a simple, solid-state approach to recapturing thermal waste energy for use as electric energy. The modular and connectable nature of each energy conversion assembly will allow the system to be tailored to a wide variety of small-scale or large-scale applications.

Although the invention has been described relative to specific embodiments thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A system for harvesting electric energy from thermal energy, comprising:
   a plurality of energy conversion assemblies, each of said energy conversion assemblies including a first heat sink, a second heat sink, a thermoelectric cell with a first side thereof in contact with said first heat sink and a second side thereof in contact with said second heat sink, and a thermal insulating gasket surrounding said thermoelectric cell and separating said first heat sink from said second heat sink;
   circuit wiring for electrically connecting to each said thermoelectric cell wherein said energy conversion assemblies are electrically connected to one another; and
   an electric power storage device coupled to said circuit wiring.

2. A system as in claim 1, further comprising a diode electrically disposed in said circuit wiring for preventing current discharge from said battery back into said circuit wiring.

3. A system as in claim 1, wherein each said first heat sink and each said second heat sink includes thermally-conductive fins.

4. A system as in claim 1, wherein each of said energy conversion assemblies further includes a bracket adapted to position a corresponding one of said energy conversion assemblies at a selected standoff distance with respect to a conduit through which a heated effluent flows.

5. A system as in claim 1, wherein each of said energy conversion assemblies further includes mechanical couplers for mechanically coupling adjacent ones of said energy conversion assemblies.

6. A system as in claim 5, wherein said mechanical couplers comprise pivoting links.

7. A system as in claim 5, wherein said mechanical couplers comprise stacking links.

8. A system as in claim 5, wherein said mechanical couplers comprise pivoting links and stacking links.

9. A system for harvesting electric energy from thermal energy, comprising:
- a plurality of energy conversion assemblies adapted to be distributed about a conduit through which a heated effluent flows, each of said energy conversion assemblies including a first finned heat sink and an opposing second finned heat sink with fins thereof extending in opposing directions, a thermoelectric cell, and a thermal-insulating gasket, said first finned heat sink and said second finned heat sink encasing said thermoelectric cell with a first side of said thermoelectric cell in contact with said first finned heat sink and a second side of said thermoelectric cell in contact with said second finned heat sink, said gasket surrounding said thermoelectric cell and separating said first finned heat sink from said second finned heat sink;
- circuit wiring for electrically connecting to each said thermoelectric cell wherein said energy conversion assemblies are electrically connected to form at least one of a parallel connection configuration and a series connection configuration; and
- a chargeable battery electrically coupled to said circuit wiring.

10. A system as in claim 9, further comprising a diode electrically disposed in said circuit wiring for preventing current discharge from said battery back into said circuit wiring.

11. A system as in claim 9, wherein each of said energy conversion assemblies further includes a bracket adapted to position a corresponding one of said energy conversion assemblies at a selected standoff distance with respect to the conduit.

12. A system as in claim 9, wherein each of said energy conversion assemblies further includes mechanical couplers for mechanically coupling adjacent ones of said energy conversion assemblies.

13. A system as in claim 12, wherein said mechanical couplers comprise pivoting links.

14. A system as in claim 12, wherein said mechanical couplers comprise stacking links.

15. A system as in claim 12, wherein said mechanical couplers comprise pivoting links and stacking links.

16. A system for harvesting electric energy from thermal energy, comprising:
- a plurality of energy conversion assemblies adapted to be distributed about a conduit through which a heated effluent flows, each of said energy conversion assemblies including a first heat sink, a second heat sink, a thermoelectric cell with a first side thereof in contact with said first heat sink and a second side thereof in contact with said second heat sink, a thermal insulating gasket surrounding said thermoelectric cell and separating said first heat sink from said second heat sink, and mechanical couplers coupled to at least one of said first heat sink and said second heat sink for mechanically coupling adjacent ones of said energy conversion assemblies;
- circuit wiring for electrically connecting to each said thermoelectric cell wherein said energy conversion assemblies are electrically connected to form at least one of a parallel connection configuration and a series connection configuration;
- a chargeable battery electrically coupled to said circuit wiring; and
- a diode electrically disposed in said circuit wiring for preventing current discharge from said battery back into said circuit wiring.

17. A system as in claim 16, wherein each said first heat sink and said second heat sink includes thermally-conductive fins.

18. A system as in claim 16, wherein each of said energy conversion assemblies further includes a bracket adapted to position a corresponding one of said energy conversion assemblies at a selected standoff distance with respect to the conduit.

19. A system as in claim 16, wherein said mechanical couplers comprise pivoting links.

20. A system as in claim 16, wherein said mechanical couplers comprise stacking links.

21. A system as in claim 16, wherein said mechanical couplers comprise pivoting links and stacking links.

\* \* \* \* \*